SEMI-CONDUCTOR DEVICES EMPLOYING CADMIUM TELLURIDE

Filed Nov. 25, 1953

INVENTOR.
Dietrich A. Jenny
BY J. C. Whittaker
ATTORNEY

United States Patent Office 2,817,799 Patented Dec. 24, 1957

2,817,799

SEMI-CONDUCTOR DEVICES EMPLOYING CADMIUM TELLURIDE

Dietrich A. Jenny, Princeton, N. J., assignor to Radio Corporation of America, a corporation of Delaware Application November 25, 1953, Serial No. 394,391

8 Claims. (Cl. 317—237)

This invention relates to improved semi-conductor materials, devices and methods of making them. More particularly, the invention relates to devices utilizing semi-conductive cadmium telluride, to methods of making p-type semi-conductive cadmium telluride and to methods of forming p-n rectifying barriers or junctions in bodies of n-type semi-conductive cadmium telluride.

Many different semi-conductor devices utilizing semi-conductive germanium and silicon are known. The operation of these devices is usually subject to relatively severe maximum temperature limitations. The temperature limitation of a typical device is determined primarily by the energy gap between the valence band and the conduction band of the semi-conductive material of the device. When the temperature of the device is increased to a point where thermal energy becomes sufficient to raise substantial numbers of electrons across the energy gap, the semi-conductive characteristics of the material are adversely affected. For example, the energy gap of germanium is about 0.7 electron volt and many devices utilizing germanium become inoperative above temperatures as low as 80° C.

Accordingly it is an object of the instant invention to provide improved semi-conductive materials.

Another object is to provide improved semi-conductive materials having relatively high energy gaps between their conduction and valence bands.

Another object is to provide improved semi-conductor devices operable at relatively high temperatures.

Another object is to provide improved semi-conductive cadmium telluride having p-type conductivity.

Another object is to provide within a body of n-type semi-conductive cadmium telluride a region of p-type conductivity and a p-n rectifying junction between said region and the remainder of the body.

Still another object is to provide a method of creating a p-n rectifying junction within a body of n-type semi-conductive cadmium telluride.

A still further object is to provide an improved method of forming an electrode fused to a body of semi-conductive cadmium telluride having a p-n rectifying junction associated therewith.

These and other objects may be accomplished by the practice of the instant invention according to which it has now been discovered that elements of the I*a* and V*a* columns of the periodic table yield p-type impurity centers when dispersed in semi-conductive cadmium telluride. It has also been found that small bodies of these elements, or of alloys including substantial proportions of them, may be fused to n-type semi-conductive cadium telluride to form electrodes having p-n rectifying junctions. The energy gap of cadmium telluride is about 1.45 electron volts, and devices based on cadmium telluride are operable at relatively high temperatures.

The invention will be described in greater detail in connection with the drawing of which:

Similar reference characters are applied to similar elements throughout the drawing.

Figure 1:
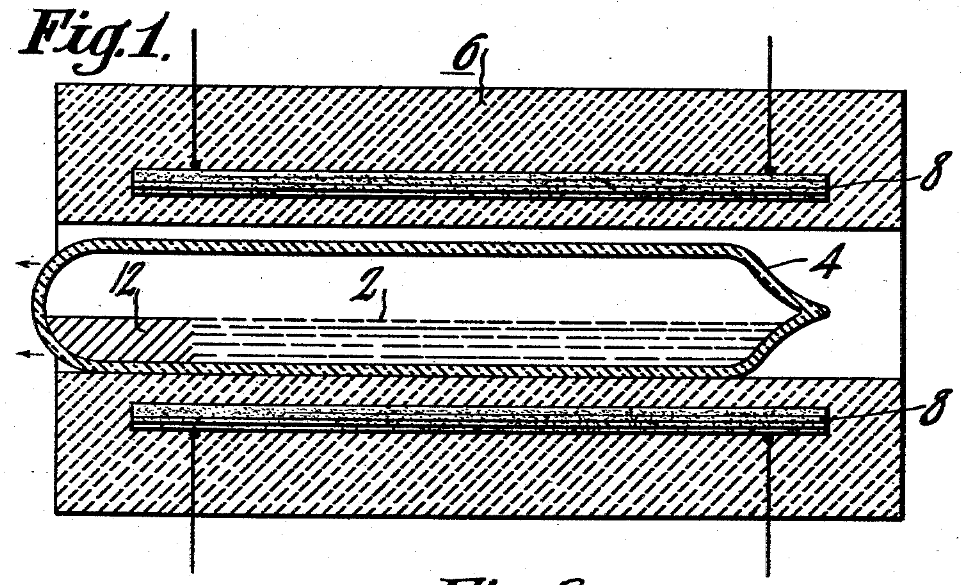
Figure 1 is a partially schematic, elevational, cross-sectional view of apparatus suitable for use in producing semi-conductive cadmium telluride according to the instant invention.

One feature of the instant invention is the production of p-type semi-conductive cadmium telluride, which may be conveniently made utilizing the apparatus shown in Figure 1. A quantity 2, for example, about 10 gms., of relatively pure cadmium telluride is placed within a refractory tube 4 which may be of quartz. In place of cadmium telluride equivalent quantities of cadmium and tellurium in stoichiometric proportions may be used. About 0.1% by wgt. of an impurity-yielding material is placed in the tube with the cadmium telluride. This material may be any of the elements of the I*a* and V*a* Groups of the Periodic Table according to Mendeleeff. (By the I*a* group is meant the group including lithium, sodium, potassium, rubidium and cesium. The V*a* group includes nitrogen, phosphorus, arsenic, antimony and bismuth.) Conveniently, antimony may be used.

Generally, any quantity in excess of $10^{-6}$ atomic percent of one or more of the elements specified is sufficient to impart p-type conductivity to semi-conductive cadmium telluride. It is preferred not to employ relatively large quantities, that is, over a few percent, of any of the impurity-yielding materials since the semi-conductive character of the cadmium telluride may be adversely affected. If, for example, too much arsenic is added a ternary compound of cadmium, arsenic and tellurium may be formed, or an alloy of cadmium telluride and cadmium arsenide or, in general, a poly-phase alloy which lacks desirable semi-conductive characteristics.

The tube is evacuated and sealed off to prevent contamination of the material and loss of any of its constituents by vaporization. The tube is placed within a furnace 6 which may be heated by any convenient means such as the electric resistance elements 8. Initially the tube is centered longitudinally within the furnace and is heated to about 1100° C. completely to melt the cadmium telluride. The material is maintained in a molten state for at least a few minutes to insure complete intermixture of the cadmium, tellurium and the impurity-yielding material.

The cadmium telluride is then frozen progressively from one end of the tube to the other by a gradient freezing process. This may be accomplished by slowly withdrawing the quartz tube from the furnace at a controlled rate. Preferably, however, to produce a more uniform ingot the tube is moved a short distance within the furnace to an asymmetrical position with respect to the heating elements. The effect of this change of position, to approximately the location illustrated, is to provide a temperature gradient along the length of the charge. One end 12 of the charge is removed from the direct heating effect of the resistance elements and is maintained at a slightly lower temperature than the remainder of the charge. The temperature of the furnace is gradually reduced to freeze the charge in a progressive longitudinal manner.

It is desirable during the freezing process to maintain the entire charge as close to the melting point as possible. The temperature gradient is preferably made barely sufficient to insure progressive freezing of the charge from one end to the other as the over-all furnace temperature is reduced. If a relatively steep temperature gradient is provided, the uniformity of the frozen ingot may be affected by preferential condensation of vapors at the low temperature end of the tube.

This process is called gradient freezing and may be accomplished by any known apparatus. Gradient freezing assists in producing a cadmium telluride ingot a major portion of which has a relatively high degree of purity. Many impurities and also a substantial proportion of the impurity-yielding material initially added to the melt are driven by the gradient freezing process to the last-frozen portion of the ingot. This effect depends of course upon the segregation characteristics of the system.

A cadmium telluride ingot thus produced comprises several relatively large crystallites, some of which may be as large as about ⅓ cubic centimeter. Substantially all of the ingot exhibits p-type semi-conductivity due primarily to the impurity centers introduced into the material by the element of column I*a* or V*a*. This is unexpected and surprising since in previously known semi-conductive materials such as germanium, impurity elements of the I*a* and V*a* columns are known to yield n-type conductivity. The apparently opposite effect in cadmium telluride is explainable on a basis of atomic substitutions in the crystal structure. It is not intended to limit the scope of the invention by this theory. It is believed, however, that the elements of column I*a* substitute themselves in the crystal lattice of cadmium telluride more readily in the place of cadmium than in the place of tellurium. Since cadmium has two valence electrons and the elements of the I*a* group have only one valence electron, one electron for each impurity atom is missing in the crystal lattice. Such missing electrons are called holes and act as positive electric charge carriers. In the case of the group V*a* elements it is believed that these are substituted in the place of tellurium in the crystal lattice, again with the creation of "hole" charge carriers.

Antimony is a preferred material for use in doping cadmium telluride according to the invention. Junction devices made utilizing antimony doped cadmium telluride have higher rectification ratios than similar devices made with other doping material. For use in making relatively low resistivity cadmium telluride, however, lithium is a preferred material according to the invention.

From a chemical point of view, the materials of the invention may be considered to be cadmium telluride containing traces of a group I*a* telluride or of a cadmium compound of a group V*a* element. This analysis is believed proper from a chemical standpoint, but since the impurity element atoms are primarily determinative of the conductivity type of the material, it is preferred to consider these atoms alone.

An alternative method of introducing group I*a* element impurity centers into cadmium telluride comprises melting cadmium telluride together with a quantity of a group I*a* telluride and freezing the mixture thus formed. This method is generally similar to the method heretofore described in connection with doping cadmium telluride with antimony. A telluride such as sodium telluride is utilized in place of antimony, and the process may be carried out in an exactly similar manner. The alkalis are relatively difficult to handle in their pure states and may be more conveniently used in the practice of the invention in the form of their tellurides.

P-type semi-conductive cadmium telluride may be produced according to the invention having from about $10^{14}$ to $10^{18}$ impurity centers per cubic centimeter of volume. The particular concentration desired will depend upon the resistivity desired in the material, which in turn depends to a large extent upon the particular use to which the material is to be put. For certain devices such as those designed to operate at relatively high frequences, for example, it may be desirable to provide semi-conductive cadmium telluride of relatively low resistivity. Other devices may require relatively high resistivity material. The resistivity varies inversely with the concentration of impurity centers. The concentration of impurity centers may be controlled by varying the amount of impurity-yielding material incorporated in the melt in much the same manner as in the production of other semi-conductive materials such as germanium.

Crystallites may be cut from selected portions of an ingot, produced as described heretofore, to provide semi-conductive wafers consisting essentially of single crystal structures. Such wafers having p-type semi-conductivity may be used to make semi-conductive devices such as those described in my co-pending application, Serial No. 394,383 filed concurrently herewith.

The p-type impurity-yielding materials described heretofore may be utilized as electrode materials in conjunction with n-type semi-conductive cadmium telluride to form semi-conductor devices having p–n rectifying junctions. These materials, especially those of column V*a*, which are relatively more stable than those of column I*a*, may be utilized with cadmium telluride to form alloy junction devices such as, for example, the device shown in Figure 3.

Figure 2:
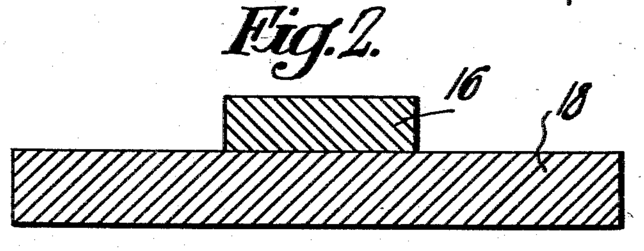
Figures 2 and 3 are schematic, elevational, cross-sectional views of a wafer of semi-conductive cadmium telluride illustrating successive steps in the production of a semi-conductor device according to the invention.
Figure 3:
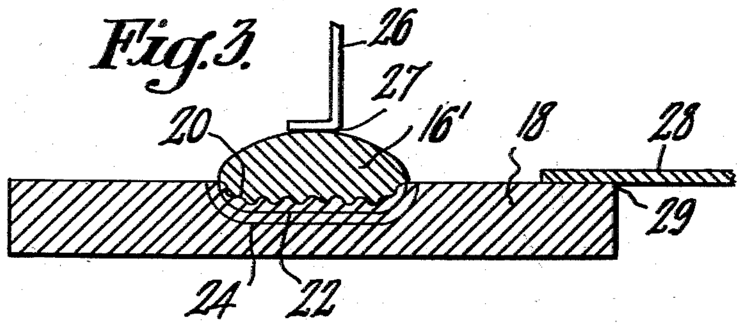

As shown in Figures 2 and 3, a pellet 16 of an impurity-yielding material selected from group V*a*, for example, antimony is placed on the surface of a wafer 18 of n-type semi-conductive cadmium telluride. The wafer is preferably a single crystal and may be of any convenient size such as about ⅛" x ⅛" x .01" thick. The pellet may be of any size smaller than the wafer. It may conveniently be made in the form of a disc about .05" in diameter and .005" thick. The wafer and pellet are heated together in a non-oxidizing atmosphere at about 400°–600° C. for about five minutes to alloy the pellet into the wafer and to form the device shown in Figure 3.

The device is generally similar in constructional details to corresponding alloy type devices made of other semi-conductive materials. It consists of the wafer 18 of n-type semi-conductive cadmium telluride and an antimony electrode 16' formed from the pellet 16 and fused to the surface of the wafer. The farthest point of penetration of the pellet into the wafer is called the alloy front and is shown by the line 22. During the alloy process a portion of the wafer is dissolved into the molten pellet and during cooling a recrystallized region 20 rich in antimony and an integral part of the wafer is formed adjacent the alloy front. This region has p-type conductivity. A p–n rectifying junction 24 is formed adjacent the alloy front. Electrical leads 26 and 28 may be attached by non-rectifying solder connections 27 and 29 to the electrode and the wafer respectively. The device may be etched, mounted and potted according to the conventional techniques utilized in conjunction with germanium semi-conductor devices.

Similar devices may be formed utilizing pellets of any of the other elements heretofore described, mixtures of these elements, or alloys comprising significant proportions of them. In general, because of their relatively high reactivity the elements of column I*a* are least convenient to use, but alloys comprising them may be satisfactorily utilized.

There have thus been described improved semi-conductive materials, devices utilizing these materials, and improved methods of making both the materials and the devices.

What is claimed is:

1. A semi-conductor device comprising a body of semi-conductive cadmium telluride having a p-type semi-conductive region, the conductivity of said region being primarily determined by the presence in said region of trace amounts of impurity centers consisting of atoms of at least one element selected from the I*a* and the V*a* columns of the Periodic Table according to Mendeleeff, and a plurality of electrodes attached to said body.

2. A semi-conductor device according to claim 1 in which said impurity centers consist essentially of antimony atoms.

3. A semi-conductor device according to claim 1 in which said impurity centers consist essentially of lithium atoms.

4. In an alloy junction type semi-conductor device including a body of n-type semi-conductive material, a fused electrode alloyed to the surface of said body and a p-n rectifying junction disposed within said body adjament said electrode, the improvement comprising said material's being cadmium telluride and said electrode comprising a material selected from the I*a* and V*a* columns of the Periodic Table according to Mendeleeff which imparts p-type conductivity to semi-conductive cadmium telluride when dispersed therein.

5. A p-type semi-conductive material consisting essentially of cadmium telluride and having trace amounts of impurity centers dispersed throughout its mass, said impurity centers consisting of predominantly of atoms of at least one element selected from the I*a* and V*a* columns of the Periodic Table according to Mendeleeff.

6. A material according to claim 5, in which said impurity centers consist predominantly of antimony atoms.

7. A semi-conductor material comprising a body of semi-conductive cadmium telluride having p-type conductivity established therein by trace amounts of elements selected from the I*a* and V*a* colums of the Periodic Table according to Mendeleeff.

8. An electrical device including a body of semi-conductive cadmium telluride having n-type and p-type conductivity regions therein, said p-type conductivity being established by elements selected from the I*a* and V*a* columns of the Periodic Table according to Mendeleeff, and a plurality of electrodes attached to said body.

References Cited in the file of this patent

UNITED STATES PATENTS

| | | |
|---|---|---|
| 2,615,060 | Martinace et al. | Oct. 21, 1952 |
| 2,629,672 | Sparks | Feb. 24, 1953 |
| 2,644,852 | Dunlap | July 7, 1953 |
| 2,697,052 | Dacey et al. | Dec. 14, 1954 |
| 2,719,799 | Christian | Oct. 4, 1955 |
| 2,743,199 | Hull et al. | Apr. 24, 1956 |

OTHER REFERENCES

Chemical Abstracts (1952), v. 46, 38201–38201*b*.